United States Patent

[11] 3,586,883

[72] Inventor Robert A. Hayes
Boca Raton, Fla.
[21] Appl. No. 889,495
[22] Filed Dec. 31, 1969
[45] Patented June 22, 1971
[73] Assignee International Business Machines Corporation
Armonk, N.Y.

[54] HIGH VOLTAGE MOS-FET ANALOG SWITCHING CIRCUIT WITH FLOATING DRIVE
2 Claims, 2 Drawing Figs.

[52] U.S. Cl. .......... 307/251, 307/246, 307/270, 307/304
[51] Int. Cl. .......... H03k 17/60
[50] Field of Search .......... 307/251, 270, 304, 279, 205, 246

[56] References Cited
UNITED STATES PATENTS 3,414,739 12/1968 Paidosh .......... 307/246 X
3,521,141 7/1970 Walton .......... 307/251 X
3,532,899 10/1970 Huth et al. .......... 307/251

*Primary Examiner*—Stanley T. Krawczewicz
*Attorney*—Sughrue, Rothwell, Mion, Zinn & MacPeak

ABSTRACT: An MOS-FET switching circuit for high voltage, bipolar, common mode analog input signals. The source-drain terminals of a switching transistor are connected in series in the signal path, and a transformer secondary winding supplying a floating drive signal is connected across the transistor gate-body terminals. The drain-source terminals of a control transistor are connected between the source terminal of the switching transistor and one end of the transformer winding to isolate the input signal from the gate terminal of the switching transistor. When a drive signal is applied, the control transistor turns on which places the drive signal across the source-gate terminals of the switching transistor to turn the latter on in a positive manner.

INVENTOR
ROBERT A. HAYES
BY Sughrue, Rothwell, Mion, Zinn & Macpeak
ATTORNEYS

HIGH VOLTAGE MOS-FET ANALOG SWITCHING CIRCUIT WITH FLOATING DRIVE

BACKGROUND OF THE INVENTION

1. Field of the Invention

This invention relates to a high voltage switching circuit for bipolar analog input signals employing Metal Oxide Silicon, Field Effect Transistors.

2. Description of the Prior Art

When using MOS-FET's for switching high voltage, bipolar analog signals, it is desirable to use a floating drive or switching signal rather than a direct or ground referenced drive signal. In the former case, the drive signal magnitude need only exceed the threshold voltage of the transistor, for example 10 volts, to be effective, while in the latter case it must exceed the sum of the input signal plus the threshold voltage, and this sum may reach 100 volts or more. A floating drive arrangement is particularly advantageous when the input signal is riding on top of an undesirable common mode voltage, since in this case the magnitude of a direct drive signal must also include the common mode voltage which may be subject to wide variations in an unpredictable manner.

In the simplest type of prior art floating drive circuits for an MOS-FET switch, the signal or input-output path is coupled across the source and drain terminals of the transistor; the drive signal, typically from a transformer secondary winding, is applied between the source and gate terminals. This arrangement suffers from the disadvantage that a negative input signal of greater magnitude than the transistor threshold voltage tends to turn the transistor on even in the absence of a drive signal, and this is true regardless of any positive body or substrate bias that may be provided.

This problem is solved by another prior art circuit in which two MOS-FET's are connected in series in the signal path with the common floating drive signal applied across their gate and drain terminals, but this arrangement is also undesirable in that it doubles the ON resistance of the switch and requires two high voltage transistors. For multiplexing applications, it is very important to (1) keep the series on resistance as small as possible, (2) be able to handle high voltage, bipolar, common mode input signals, and (3) have a normally off switch under all conditions and in spite of a large common mode input signal.

SUMMARY OF THE INVENTION

This invention effectively overcomes the problems noted above attendant with the prior art circuits by providing an MOS-FET switching circuit for high voltage, bipolar, common mode analog input signals employing a switching transistor whose source-drain terminals are connected in series in the signal path and a control transistor whose drain-source terminals are connected between the input signal and one end of a transformer secondary winding which supplies the floating drive signal. The other end of the transformer winding is connected to the gate terminal of both transistors. In the disclosed circuit, the switch always remains off in the absence of the drive signal since the gate of the switching transistor is referenced to the most positive of its drain or source terminals through its internal substrate diode connected to the low side of the drive winding. When a drive signal in excess of the threshold voltage of the transistors is applied, it immediately turns the control transistor on which references the lower or positive end of the drive winding to the source terminal of the switching transistor. This in turn renders the gate of the switching transistor negative with respect to its source which turns the switching transistor on to effect the desired switch closing action in a positive and reliable manner, independent of the input signal voltage, signal transients, or stray leakages.

BRIEF DESCRIPTION OF THE DRAWINGS

The foregoing and other objects, features and advantages of this invention will be apparent from the following more particular description of a preferred embodiment of the invention, as illustrated in the accompanying drawings, wherein.

DESCRIPTION OF THE PREFERRED EMBODIMENT

Figure 1:
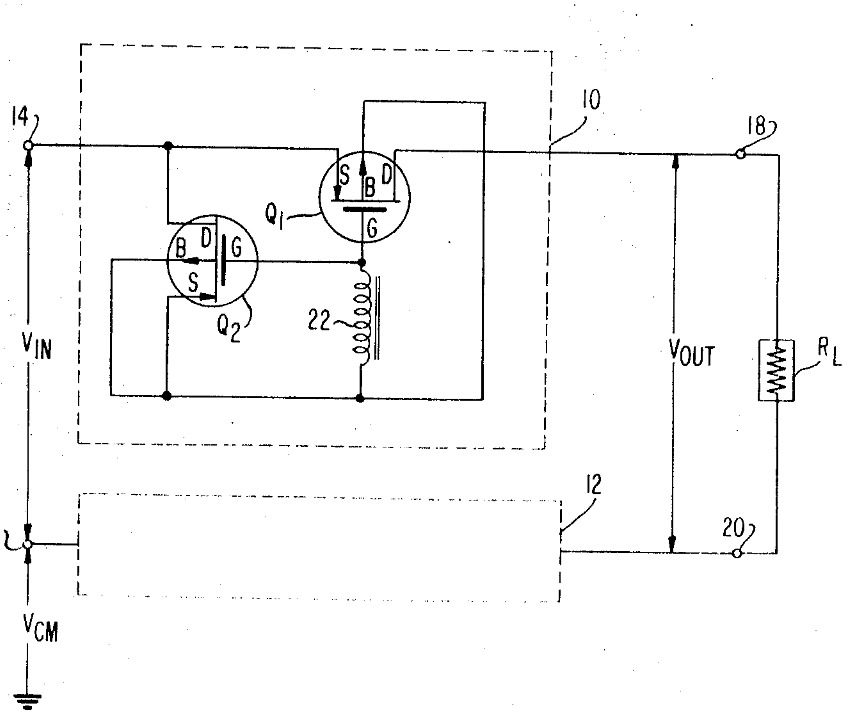
FIG. 1 shows a differential signal switching circuit employing two individual switching devices each constructed in accordance with the teachings of this invention.

Referring to the drawing, FIG. 1 shows switching circuits 10 and 12 for connecting an analog input signal $V_{in}$ appearing across input terminals 14 and 16 to a load device $R_L$ connected across output terminals 18 and 20. Only switching circuit 10 is shown in detail since switching circuit 12 is a mirror image thereof. The input signal is a differential signal in the example shown and may have either positive or negative polarity. Terminal 16 is isolated from ground by an undesired common mode voltage $V_{cm}$.

The switching circuit 10 includes a switching MOS-FET $Q_1$, a control MOS-FET $Q_2$, and a transformer secondary winding 22 connected as shown in FIG. 1. The letters adjacent the transistor terminals designate the source S, the drain D, the gate G, and the body or substrate B.

Figure 2:
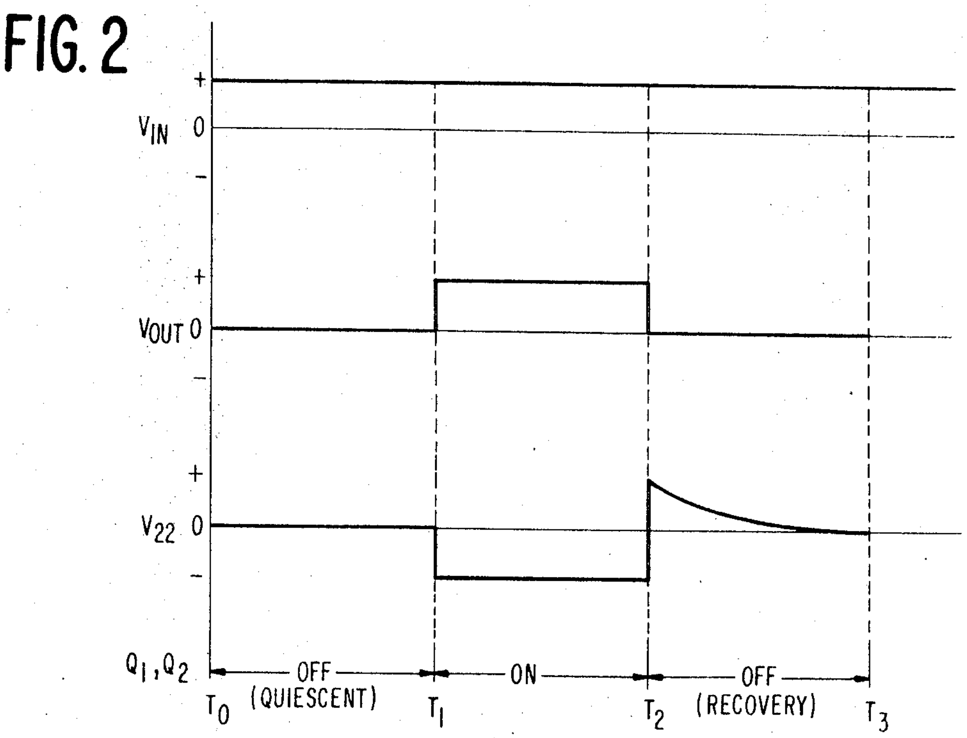
FIG. 2 shows the input, output, and drive signal waveforms as a function of time.

In the absence of a drive signal, the switch is off and $Q_1$ and $Q_2$ are in their quiescent states, corresponding to the $T_0$—$T_1$ time interval in the waveform diagrams of FIG. 2. In this state, there is no voltage drop across winding 22 and therefore zero volts appear between the gate-source and gate-body terminals of $Q_2$. Internal diode action between the drain and body of $Q_1$ prevents the body from being more negative than the voltage drop across the diode (approximately one-half volt) with respect to the drain. $Q_2$ is thus held in an OFF condition regardless of the magnitude or polarity of the input signal.

In a similar manner, with no voltage across winding 22, the gate of transistor $Q_1$ can be no more negative than an internal diode drop with respect to the most positive of the source or drain of $Q_1$, and the latter is therefore also in an OFF condition.

To turn the switch on, a drive signal is induced in winding 22 such that the upper end of the winding, connected to the gates of $Q_1$ and $Q_2$, becomes negative with respect to the lower end by an amount in excess of the threshold voltages of the transistors. This renders the gate of $Q_2$ negative with respect to its source by an amount equal to the magnitude of the drive signal which turns $Q_2$ on. With the control transistor $Q_2$ on, the lower end of the drive winding becomes referenced to the source of the switching transistor $Q_1$ through the drain-source path of $Q_2$, which exhibits only a nominal voltage drop. This applies substantially all the drive signal across the source-gate terminals of $Q_1$ to turn $Q_1$ on and close the circuit path between input terminal 14 and output terminal 18. A similar action takes place at the same time, of course, in switching circuit 12. The input, output, and drive signals during the ON time of the circuits are shown between time intervals $T_1$ and $T_2$ in FIG. 2.

If the drive signal is removed at time $T_2$ the polarity of winding 22 sharply reverses at first, due to inductive storage, and then decays down to zero. This switches both transistors $Q_1$ and $Q_2$ off to return the circuit to its original condition as previously described.

The control transistor $Q_2$ is required in the circuit to ensure the positive and reliable turn-on of switching transistor $Q_1$. If $Q_2$ were absent from the circuit, a drive signal induced in winding 22, rather than forcing the gate of $Q_1$ negative with respect to the source or drain, might instead force the body positive owing to the floating nature of the drive signal, with the gate potential remaining about equal to that of the source and drain. This would result in $Q_1$ remaining off, at least initially, and the resulting circuit action would be determined completely by the stray capacitances of the circuit, which is unreliable at best.

While the invention has been particularly shown and described with reference to a preferred embodiment thereof, it will be understood by those skilled in the art that various changes in form and details may be made therein without departing from the spirit and scope of the invention.

What I claim is:

1. In a floating drive switching circuit for a bipolar, analog input signal including a switching MOS-FET having its source and drain terminals connected between an input terminal and an output terminal, the improvement comprising:

a. a control MOS-FET, b. means having first and second terminals for applying a drive signal to the circuit, the first terminal being connected to the gate terminals of both the switching and control MOS-FET's, c. means connecting the input terminal to the drain terminal of the control MOS-FET, and d. means connecting the second terminal of the drive signal applying means to the source and body terminals of the control MOS-FET and to the body terminal of the switching MOS-FET.

2. A switching circuit as defined in claim 1 wherein the drive signal applying means is the secondary winding of a transformer.